United States Patent
Satake

[19]

[11] Patent Number: 5,818,109
[45] Date of Patent: Oct. 6, 1998

[54] SEMICONDUCTOR INTEGRATED CIRCUIT DEVICE HAVING WIRING STRUCTURE EFFECTIVE AGAINST MIGRATION AND MASK MIS-ALIGNMENT AND PROCESS OF FABRICATION THEREOF

[75] Inventor: Tomomitsu Satake, Tokyo, Japan

[73] Assignee: NEC Corporation, Japan

[21] Appl. No.: 577,864

[22] Filed: Dec. 22, 1995

[30] Foreign Application Priority Data

Dec. 27, 1994 [JP] Japan .................................. 6-323453

[51] Int. Cl.⁶ ........................... H01L 23/48; H01L 23/52; H01L 29/40
[52] U.S. Cl. ........................... 257/767; 257/751; 257/758; 257/763
[58] Field of Search ........................... 257/767, 751, 257/758, 763, 764, 765, 766

[56] References Cited

FOREIGN PATENT DOCUMENTS

| | | | |
|---|---|---|---|
| 60-115244 | 6/1985 | Japan | 257/767 |
| 63-102243 | 5/1988 | Japan | 257/767 |
| 64-29836 | 2/1989 | Japan | 257/767 |
| 1-272139 | 10/1989 | Japan | 257/767 |
| 2-32544 | 2/1990 | Japan | 257/767 |
| 3-719636 | 3/1991 | Japan | 257/767 |
| 3-274732 | 12/1991 | Japan | 257/767 |
| 6-3803 | 1/1994 | Japan | 257/767 |

OTHER PUBLICATIONS

"Electromigration in Aluminum Film Stripes Coated with Anodic Aluminum Oxide Films"; Satake et al: Japanese Journal of Applied Physics; vol. 12, No. 4; Apr. 1973; pp. 518–522.

*Primary Examiner*—Steven H. Loke
*Attorney, Agent, or Firm*—Haynes, Soloway, Hennessey, Grossman & Hage, P.C.

[57] ABSTRACT

A wiring structure incorporated is formed on an insulating layer, and includes an aluminum-based metal strip extending on the insulating layer and a barrier layer of refractory metal covering the aluminum-based metal strip so as to prevent the aluminum-based metal layer from electro-migration; the two-level barrier layer has fin portions extending on both sides of the aluminum-based metal layer therealong, and the fin portions prevent the wiring structure from increase of contact resistance due to a mis-alignment.

5 Claims, 13 Drawing Sheets

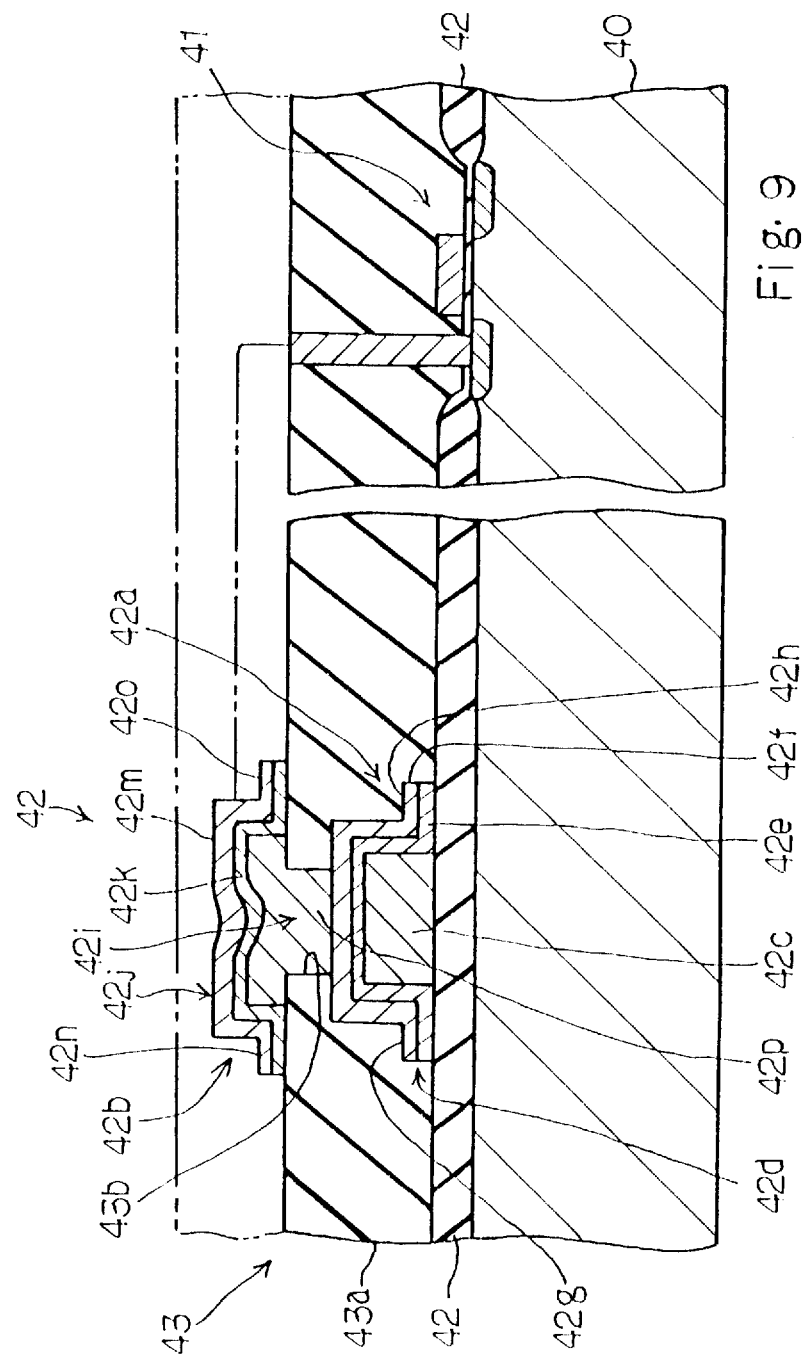

SEMICONDUCTOR INTEGRATED CIRCUIT DEVICE HAVING WIRING STRUCTURE EFFECTIVE AGAINST MIGRATION AND MASK MIS-ALIGNMENT AND PROCESS OF FABRICATION THEREOF

FIELD OF THE INVENTION

This invention relates to a semiconductor integrated circuit device and, more particularly, to a semiconductor integrated circuit device having a highly reliable wiring structure and a process of fabrication thereof.

DESCRIPTION OF THE RELATED ART

The circuit components of the semiconductor integrated circuit device have been progressively miniaturized, and, accordingly, the signal wirings have been getting narrower and narrower. In order to guarantee the durability of the semiconductor integrated circuit device, various technologies have been proposed as follows.

Japanese Utility Model Publication of Unexamined Application No. 64-29836, which is hereinbelow referred to as "first document", discloses a wiring structure against a hillock. The hillock is a kind of micro-projection, and takes place during a heat treatment over 400 degrees centigrade to an aluminum-based layer. The hillock introduces difficulties in lithography and subsequent step coverage, and is causative of a disconnection. The Japanese Utility Model Publication of Unexamined Application proposes to overlay the aluminum-based layer with a refractory metal layer such as a titanium layer or a tungsten layer. The refractory metal layer prevents the aluminum-based layer from the hillocks.

Japanese Patent Publication of Unexamined Application No. 3-374732, which is hereinbelow referred to as "second document", discloses a multi-level wiring implemented by metal films different in grain size. The multi-level wiring is effective against the electro-migration and the stress-migration, and is hardly disconnected even if the width is decreased.

Japanese Patent Publication of Unexamined Application No. 1-272139, which is hereinbelow referred to as "third document", discloses a wiring constituted by an aluminum layer covered with a protection layer of refractory metal such as tungsten. The protection layer consists of a thin refractory metal film selectively covering the upper and side surfaces of the aluminum layer and side walls of refractory metal provided on the refractory metal film covering the side surfaces of the aluminum layer. The refractory metal is deposited through a chemical vapor deposition, and is anisotropically etched so as to form the protection layer. According to the Japanese Patent Publication of Unexamined Application, the side walls creates a smooth surface over the wiring, and prevents the wiring from hillocks and the migration.

Japanese Patent Publication of Unexamined Application No. 60-115244, which is hereinbelow referred to as "fourth document", teaches a buffer layer of, for example, silicon formed on an aluminum wiring before the aluminum wiring is covered with a refractory metal layer. Metal halide gas is used in the covering step with the refractory metal layer, and the buffer layer of aluminum-silicon compound reacts with the metal halide so as to produce a volatile compound. If the buffer layer is not incorporated, the metal halide gas leaves residue on the aluminum wiring, and the residue is causative of the electro-migration, an erosion and large contact resistance. However, the buffer layer removes the residue, and the aluminum wiring perfectly covered with the refractory metal is free from the electro-migration, the erosion and the large contact resistance.

Japanese Patent Publication of Unexamined Application No. 3-71636, which is hereinbelow referred to as "fifth document", discloses a wiring structure effective against the electro-migration. An aluminum layer and two metal layers different in substance form in combination the wiring structure. The aluminum layer is wrapped in one of the two metal layers which in turn is wrapped in the other metal layer. The inner metal layer aims at a suppression of halide, and prevents the aluminum layer from increase of resistance.

Japanese Patent Publication of Examined Application No. 6-3803, which is hereinbelow referred to as "sixth document", discloses a self-aligned contact hole for a wiring layer. The inter-level insulating layer is thin over the wiring layer and thick on both sides of the wiring layer. The inter-level insulating layer thus different in thickness is produced by depositing a first insulating layer, etching the first insulating layer until the aluminum layer is exposed, thereby leaving parts of insulating layer on both sides of the aluminum layer, etching a part of the aluminum layer so as to decrease the thickness and depositing a second insulating layer over the entire surface. Even if a photo-resist mask for the contact hole is deviated from the wiring layer, an etchant exposes a part of the wiring layer without passing through the inter-level insulating layer.

The present inventors evaluate the above described prior art technologies as follows.

The refractory metal layer disclosed in the first document covers only the upper surface of the aluminum layer, and is effective against aluminum hillocks due to the heat treatment. However, the side surfaces of the aluminum layer are uncovered with a refractory metal layer. Therefore, aluminum hillocks and aluminum spikes take place due to the electro-migration, and the prior art wiring structure is not durable because of the short-circuit and the disconnection due to the electro-migration.

Although the second document insists on the effect of the different grain size against the electro-migration, the present inventors could not confirm the effect, and doubts the durability of the prior art wiring structure disclosed in the second document.

The wiring structure disclosed in the third document has the side walls of the refractory metal on the side surface of the aluminum layer. However, the side walls are less effective against the electro-migration as reported by Satake et. al. in "Electro-migration in Aluminum Film Strips Coated with Anodic Aluminum Oxide Films", Japan journal of Applied Physics, vol. 12, No. 4, 518 page to 522, April 1973. On the other hand, the refractory metal film on the upper surface is extremely thin, and hardly prevents the aluminum layer from hillocks and spikes due to the electro-migration under large current density. Moreover, the prior art wiring structure disclosed in the third document is not reproducible, because the etching rate of the anisotropic etching is dependent on the film quality of the refractory metal and the pitch of the aluminum layers. Thus, the wiring structure disclosed in the third document is less effective against the deterioration due to the electro-migration.

The prior art wiring structures disclosed in the fourth and fifth documents are effective against the deterioration due to the electro-migration. However, if the prior art wiring structure is, by way of example, held in contact with an impurity region formed in a silicon substrate through a contact hole, the silicon is precipitated in the contact hole, and the prior art wiring structure suffers from large contact resistance.

The prior art wiring structure disclosed in the fifth document is free from the precipitation of silicon, because two refractory metal films are used as a protection layer against the electro-migration.

The prior art wiring structure disclosed in the sixth document is so complex. The deposition of the first insulating layer, the partial etching on the first insulating layer, the partial etching of the aluminum layer and the deposition of the second insulating layer form the inter-level insulating structure, and the process sequence consumes large amount of time and cost.

The above described prior art technologies are broken down into two categories, i.e., the counter-measurement against the electro-migration and the counter-measurement against the mask mis-alignment. However, no prior art technology does not consider both of the electro-migration and the mask mis-alignment.

SUMMARY OF THE INVENTION

It is therefore an important object of the present invention to provide a semiconductor integrated circuit device a wiring structure of which is prevented from the electro-migration and a mask mis-alignment.

It is another important object of the present invention to provide a simple process of fabricating the semiconductor integrated circuit having the wiring structure.

To accomplish the object, the present invention proposes to form fin portions of a barrier layer on both sides of an aluminum-base metal strip.

In accordance with one aspect of the present invention, there is provided a wiring structure incorporated in a semiconductor integrated circuit device, comprising: a core metal strip formed of a substance selected from the group consisting of aluminum and aluminum-alloy, and extending on an insulating layer; and a barrier layer against an electro-migration including at least one refractory metal layer, the at least one refractory metal layer having a central portion covering an entire exposed surface of the core metal strip, and peripheral portions merged with both sides of the central portion and extending on the insulating layer along the core metal strip.

In accordance with another aspect of the present invention, there is provided a process of fabricating a wiring structure of a semiconductor integrated circuit device, comprising the steps of: a) depositing a substance selected from the group consisting of aluminum and aluminum alloy on an insulating layer so as to cover the insulating layer with a core metal layer; b) patterning the core metal layer into at least one core metal strip; and c) covering the core metal layer with a barrier layer formed of a refractory metal and having a central portion provided on an exposed surface of the core metal layer and peripheral portions merged with the central portion and extending on the insulating layer along the core metal layer.

The step c) may includes the sub-steps of c-1) forming a photo-resist mask on the insulating layer in such a manner as to expose the at least one core metal strip and parts of the insulating layer on both sides of the at least one core metal strip to a gap formed therein; c-2) depositing the refractory metal layer so as to cover an upper surface of the photo-resist mask, the parts of the insulating layer and upper and side surfaces of the at least one core metal strip with a refractory metal layer; and c-3) removing the photo-resist mask together with a part of the refractory metal layer on the upper surface of the photo-resist mask, thereby leaving another part of the refractory metal layer on the parts of the insulating layer and the upper and side surfaces of the at least one core metal strip.

BRIEF DESCRIPTION OF THE DRAWINGS

The features and advantages of the semiconductor integrated circuit device and the process according to the present invention will be more clearly understood from the following description taken in conjunction with the accompanying drawings in which:

FIG. 9 is a cross sectional view showing a multi-level wiring structure according to the present invention;

DESCRIPTION OF THE PREFERRED EMBODIMENTS

First Embodiment

Figure 1A:
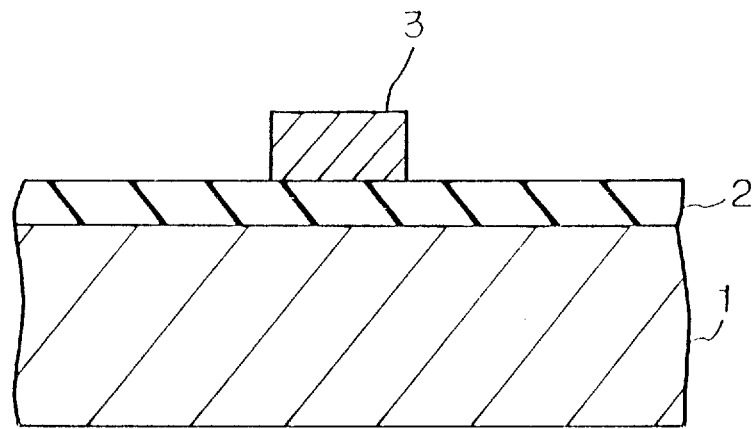
FIGS. 1A to 1C are cross sectional views showing a process sequence for fabricating a wiring structure incorporated in a semiconductor integrated circuit device according to the present invention.
Figure 1B:
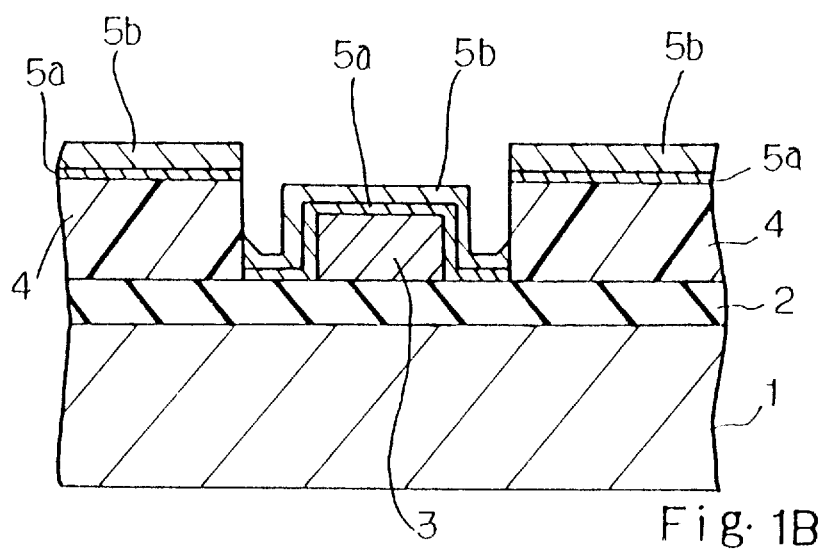
Figure 1C:
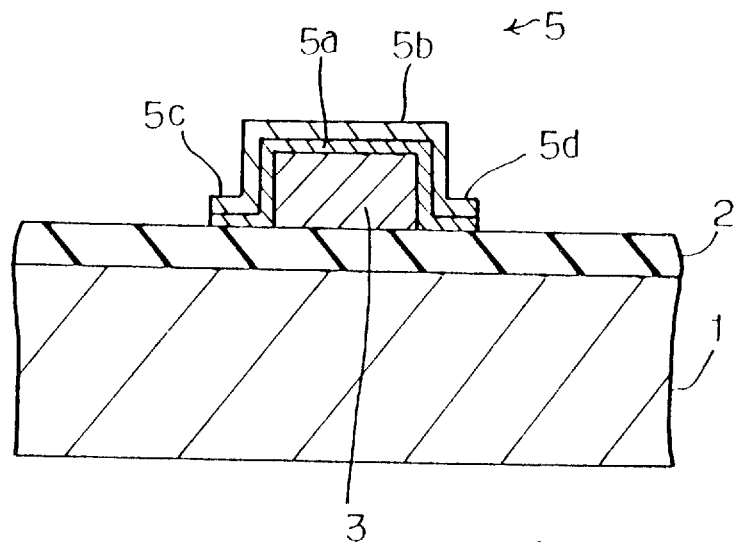

Referring first to FIGS. 1A to 1C of the drawings, a process sequence starts with preparation of a silicon substrate 1 covered with an insulating layer 2. Though not shown in the figures, circuit components such as field effect transistors are fabricated on the silicon substrate 1, and will be selectively connected through a wiring arrangement for forming an integrated circuit.

An aluminum alloy such as, for example, aluminum-copper alloy is deposited over the insulating layer 2 by using an electron-beam evaporation, and the aluminum alloy layer is patterned through lithographic techniques into aluminum alloy strips 3. Only one of the aluminum alloy strips 3 is illustrated in FIGS. 1A to 1C, and, accordingly, description is focused on the aluminum alloy strip 3. The aluminum alloy strip 3 is 5000 to 6000 angstroms in thickness, and the resultant structure of this stage is illustrated in FIG. 1A.

The structure shown in FIG. 1A is coated with a photoresist layer, and a pattern similar to the pattern of the aluminum alloy strips 3 is transferred to the photo-resist layer. When the photo-resist layer is developed, the photo-resist is removed from the upper surface of the aluminum alloy strip 3 and parts of the insulating layer 2 on both sides of the aluminum alloy strip 3, and a photo-resist mask 4 is formed on the insulating layer 2. The photo-resist mask 4 is spaced from the side surfaces of the aluminum alloy strip 3 by a predetermined distance.

Subsequently, titanium is sputtered to 300 to 500 angstroms on the entire surface of the structure, and the upper surface of the photo-resist mask 4, the upper and side surfaces of the aluminum alloy strip 3 and the exposed surfaces of the insulating layer 2 are covered with the titanium layer 5a.

Subsequently, titanium nitride is sputtered to 800 to 1000 angstroms in thickness over the entire surface of the titanium layer 5a. The titanium layer 5a is covered with the titanium nitride layer 5b as shown in FIG. 1B.

The titanium layer 5a is deposited in the vacuum chamber of the sputtering system, and the titanium nitride layer 5b is deposited by introducing gaseous mixture of argon and nitrogen into the vacuum chamber. Thus, the titanium layer 5a and the titanium nitride layer 5b are successively formed without breakage of the vacuum in the vacuum chamber. The combination of the titanium layer 5a and the titanium nitride layer 5b is appropriate for high productivity.

A refractory metal layer such as the titanium layer 5a increases the adhesion between the aluminum alloy strip 3 and an upper metal layer such as the titanium nitride layer 5b, and, for this reason, the two-level structure enhances the reliability of the wiring structure.

The titanium layer 5a and the titanium nitride layer 5b are so thin that the side surfaces of the photo-resist mask 4 are not covered with the titanium layer 5a and the titanium nitride layer 5b.

Subsequently, the photo-resist layer 4 is stripped off together with the titanium layer 5a and the titanium nitride layer 5b on the upper surfaces thereof. As a result, the titanium layer 5a and the titanium nitride layer 5b are left on the upper and side surfaces of the aluminum alloy strip 3 and the insulating layer 2 on both sides of the aluminum alloy strip 3 as shown in FIG. 1C.

Figure 2:
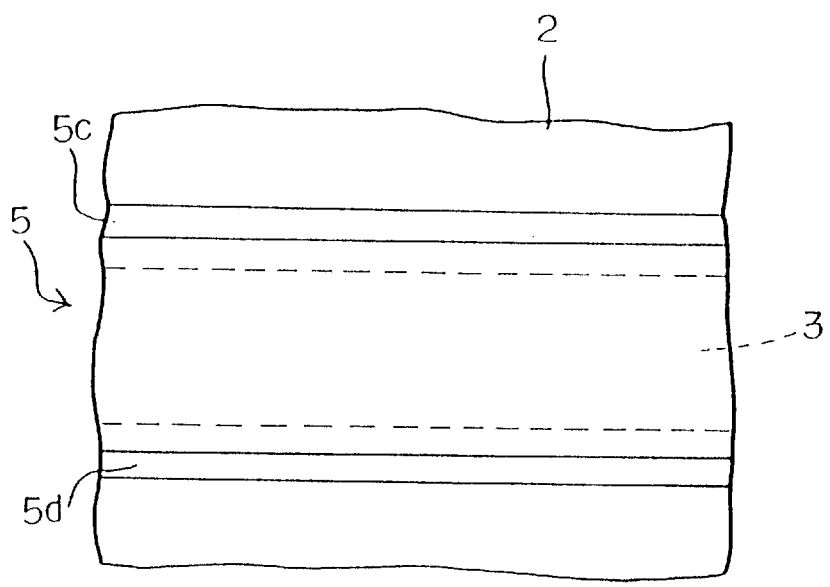
FIG. 2 is a plan view showing the wiring structure fabricated through the process sequence.

The titanium layer 5a and the titanium nitride layer 5b form in combination a two-level barrier layer 5, and the two-level barrier layer 5 has fin portions 5c and 5d extending on the insulating layer 2 along the aluminum alloy strip 3 (see FIG. 2). The aluminum alloy strip 3 is perfectly wrapped in the two-level barrier layer 5, and, for this reason, the two-level barrier layer 5 effectively prevents the aluminum alloy strip 3 from the electro-migration. The two-level barrier layer 5 is formed through a lift-off technique, and the patterning step for the two-level barrier layer 5 is simple.

In this instance, the fin portions 5c and 5d serve as peripheral portions of a barrier layer against an electro-migration.

Figure 3A:
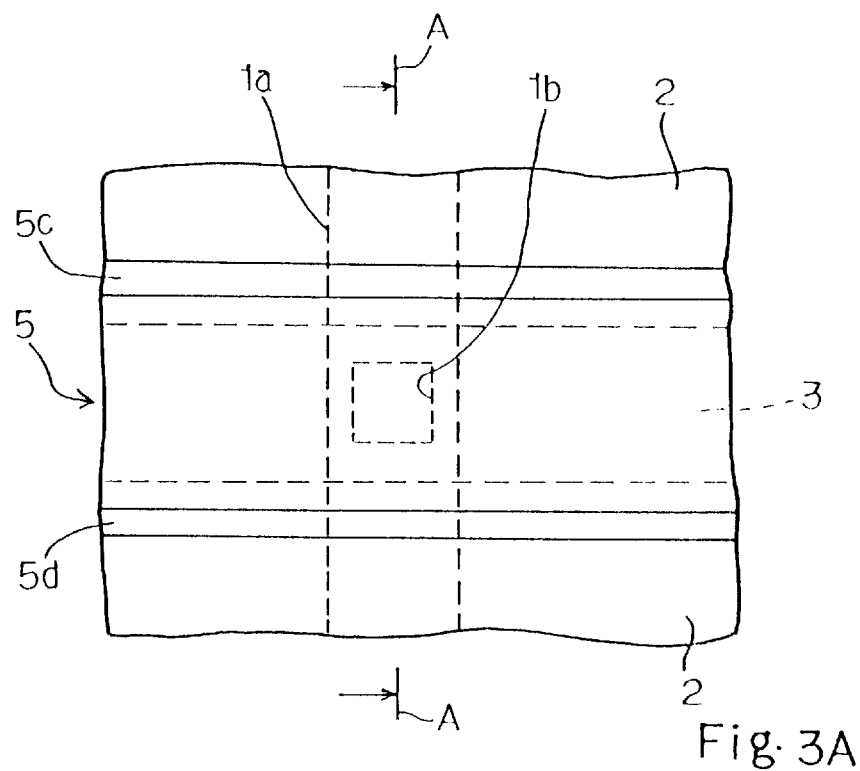
FIGS. 3A and 3B are plan views showing the wiring structures passing over a contact hole exposing a silicon substrate without and with a mis-alignment.
Figure 4A:
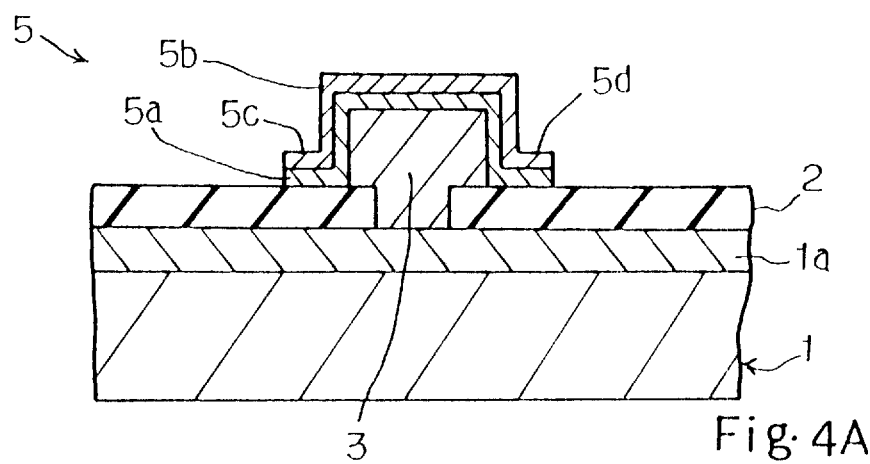
FIGS. 4A and 4B are cross sectional views taken along line A—A of FIG. 3A and line B—B of FIG. 3B and showing the wiring structures held in contact with an impurity region.
Figure 4B:
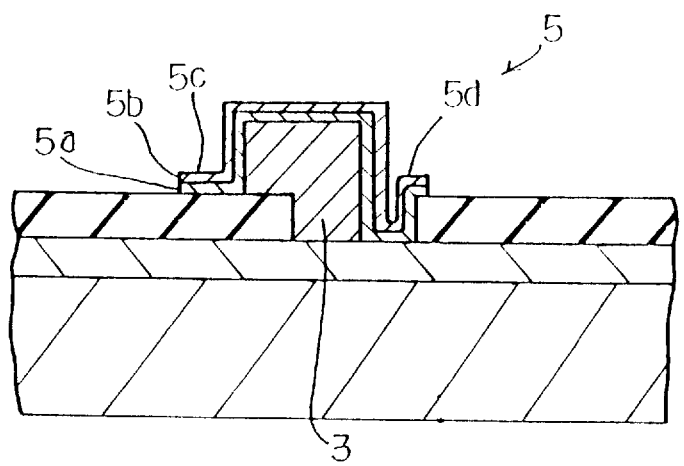

The wiring structure, i.e., the aluminum alloy strip 3 covered with the two-level barrier layer 5 is incorporated in the wiring arrangement, and extends on the insulating layer 2. The wiring structure is held in contact with an impurity region 1a through a contact hole 1b as shown in FIGS. 3A and 4B.

Figure 3B:
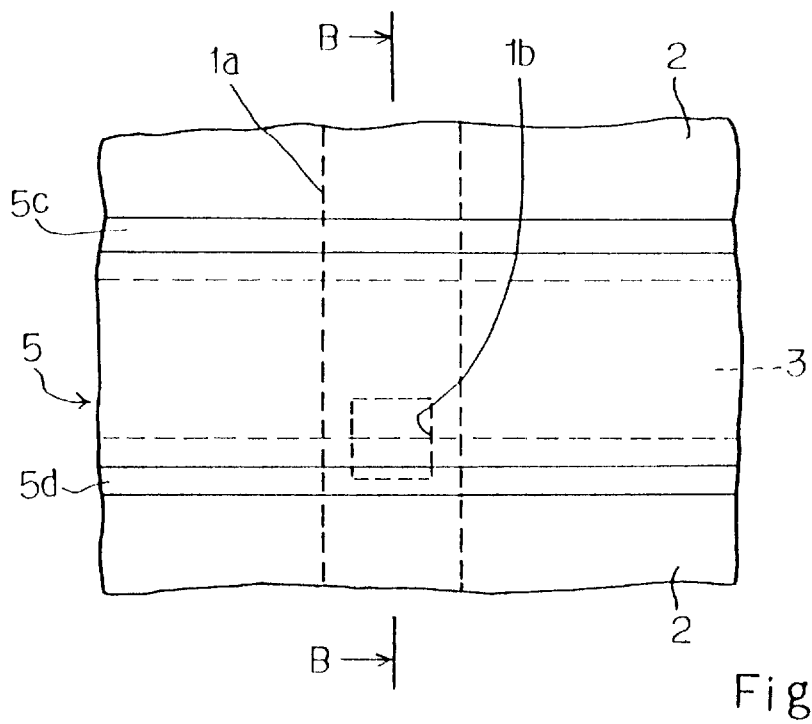

The impurity region 1a is opposite in conductivity type to the silicon substrate 1, and the contact hole 1b is formed in the insulating layer 2 prior to the deposition of the aluminum alloy layer. Even if the aluminum alloy strip 3 is laterally deviated from the appropriate position as shown in FIG. 3B and 4B, the fin portion 5d partially fills the contact hole 1b, and the wiring structure does not widely decrease the contact resistance.

In this instance, the titanium layer 5a and the titanium nitride layer 5b form in combination the two-level barrier layer 5. However, another wiring structure according to the present invention may use titanium-tungsten or platinum instead of the titanium nitride. The two-level barrier layer 5 may be formed by the combination of a molybdenum layer and a nickel layer or the combination of a chromium layer and a nickel layer. A combination using a copper film is also available for the two-level barrier layer 5, and the combination of a titanium layer and a tungsten layer may form yet another two-level barrier layer.

The titanium-tungsten layer and the platinum layer are deposited through a sputtering, and the molybdenum layer, the nickel layer, the chromium layer and the copper layer are deposited by using the electron-beam evaporation.

The aluminum alloy is not limited to aluminum-copper alloy, and pure aluminum may be used for the aluminum strip.

A designer intentionally provide the fin portions 5c and 5d to the barrier layer 5. When the designer determines the width of the fin portions 5c and 5d, he takes a difference between the dimensions of the contact-hole 1b and the width of the aluminum alloy strip 3 and the accuracy of an aligner used for the pattern formation into account.

As will be appreciated from the foregoing description, the aluminum alloy strip 3 is perfectly wrapped in the two-level barrier layer 5, and is effectively prevented from the electro-migration.

The two-level barrier layer 5 is formed of refractory metal and/or refractory metal alloy, and silicon does not precipitated in a contact hole.

The two-level barrier layer 5 is patterned by using the lift-off technique, and the patterning is simple.

Finally, even if the wiring structure is deviated from the appropriate position over the contact hole 1b, the fin portion supplements the mis-alignment, and keeps the contact resistance low.

Second Embodiment

In case where a titanium layer and a tungsten layer form the two-level barrier layer 5, a wiring structure embodying the present invention is fabricated as follows.

Figure 5A:
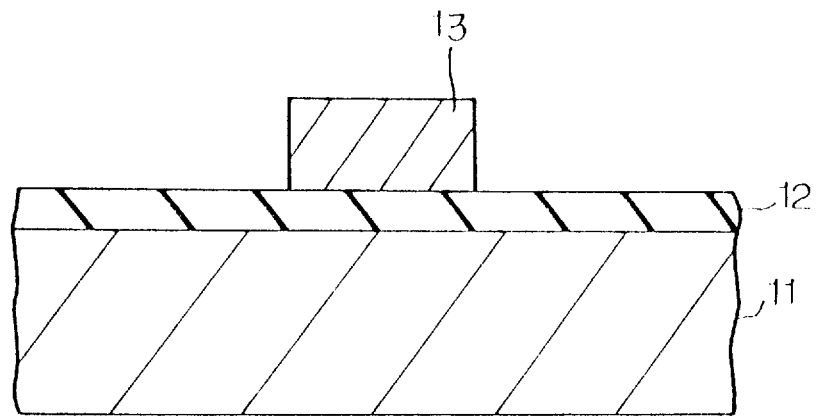
FIG. 5A to 5D are cross sectional views showing another process sequence for fabricating a wiring structure according to the present invention.

The process sequence also starts with preparation of a silicon substrate 11 covered with an insulating layer 12. An aluminum-based metal layer is deposited on the insulating layer 12, and is patterned into an aluminum alloy strip 13 as shown in FIG. 5A.

Figure 5B:
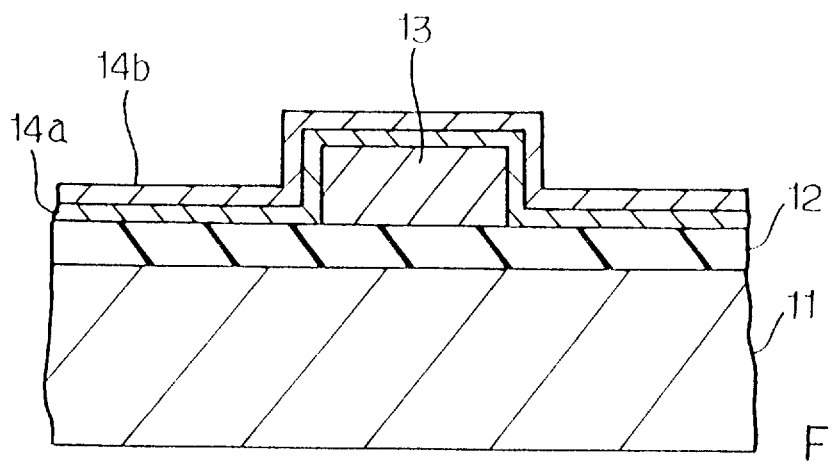

A titanium layer 14a is deposited by using the electron-beam evaporation, and a tungsten layer 14b is deposited through a chemical vapor deposition using gaseous mixture of $WF_6$ and $H_2$, by way of example. The resultant structure of this stage is illustrated in FIG. 5B.

Figure 5C:
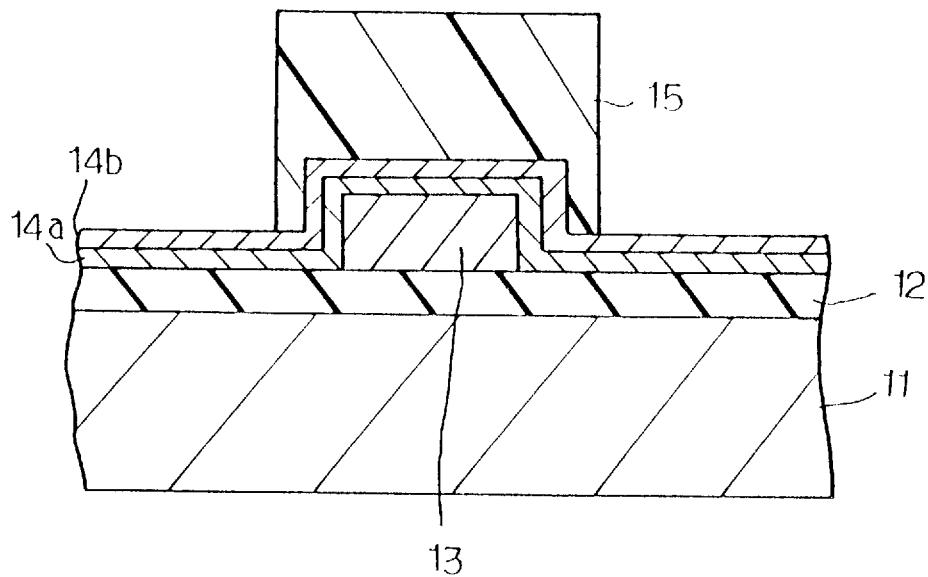

Photo-resist solution is spun onto the entire surface of the tungsten layer 14b, and a pattern is transferred to the photo-resist layer. The pattern in wider than the aluminum alloy strip 13, and extend along the aluminum alloy strip 13. The photo-resist layer is developed, and a photo-resist mask 15 is left over the aluminum alloy strip 13. The photo-resist mask 15 is wider than the aluminum alloy strip 13 as shown in FIG. 5C.

The tungsten layer 14b is patterned by using a plasma etching using $CF_4$, and, subsequently, the titanium layer 14a is patterned through an etching. The etchant for the titanium layer 14a is required to have a selectivity to the insulating layer.

Figure 5D:
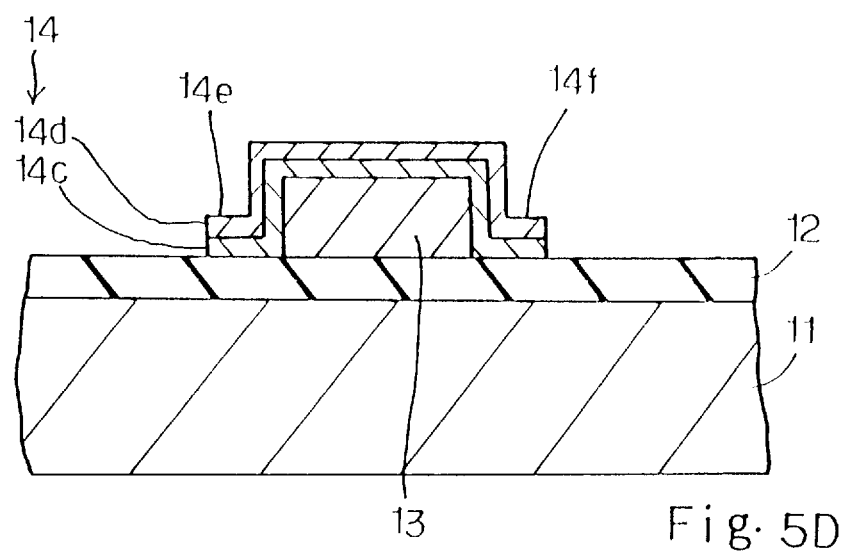

Finally, the photo-resist mask 15 is stripped off, and a patterned tungsten layer 14d and a patterned titanium layer 14d are left over the aluminum alloy layer 13 as shown in FIG. 5D. The patterned tungsten layer 14c and the patterned titanium layer 14d form in combination a barrier layer 14, and the barrier layer has fin portions 14e and 14f on both sides of the aluminum alloy strip 13.

The wiring structure implementing the second embodiment achieves all of the advantages of the first embodiment.

Third Embodiment

Figure 6:
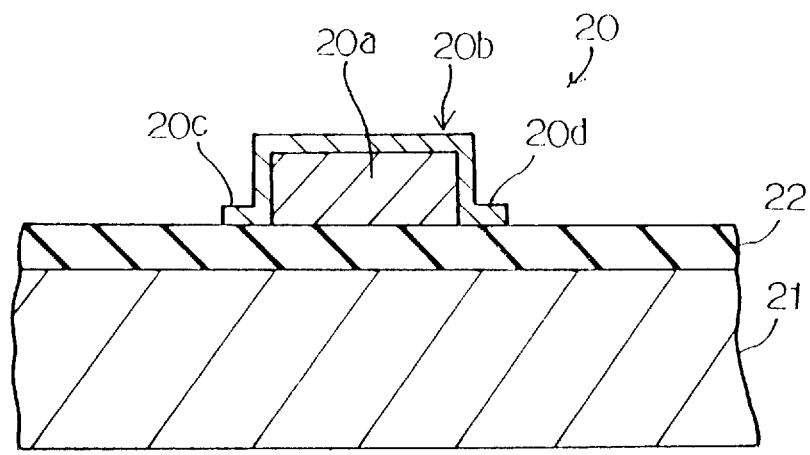
FIG. 6 is a cross sectional view showing the structure of yet another wiring structure according to the present invention.

Turning to FIG. 6 of the drawings, yet another wiring structure 20 is fabricated over a semiconductor substrate 21 covered with an insulating layer 22. The wiring structure 20 includes an aluminum alloy strip 20a extending on the insulating layer 22 and a single-level barrier layer 20b. The barrier layer 20b is, by way of example, formed of tungsten, and has fin portions 20c and 20d extending on the insulating layer 22 along the aluminum alloy strip 20a. The wiring structure 20 is fabricated through a similar process sequence to the first or second embodiment.

The aluminum alloy strip 20a is perfectly wrapped in the barrier layer 20b, and the barrier layer 20b prevents the aluminum alloy strip 20a from the electro-migration. The wiring structure achieves all the advantages of the first embodiment, and is rather simple in structure.

Fourth Embodiment

Figure 7A:
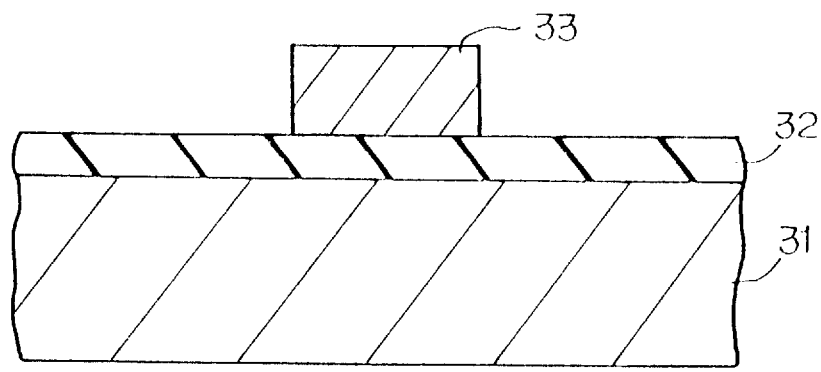
FIGS. 7A to 7E are cross sectional view showing a process sequence of fabricating a wiring structure according to the present invention.

Turning to FIGS. 7A to 7E of the drawings, a process sequence for fabricating a two-level wiring structure starts with preparation of a semiconductor substrate 31 covered with a lower insulating layer 32. An aluminum-based metal layer is deposited over the entire surface of the lower insulating layer 32, and the aluminum-based metal layer is patterned into an aluminum-based metal strip 33 as shown in FIG. 7A.

Figure 7B:
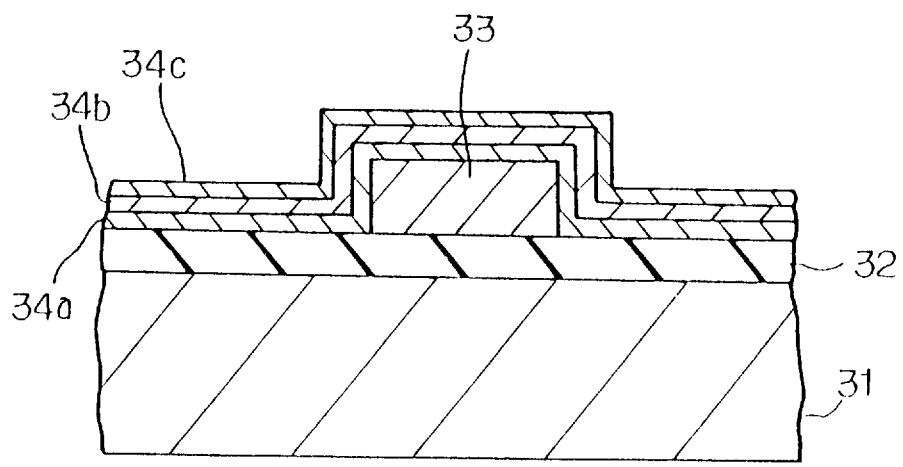
Figure 7C:
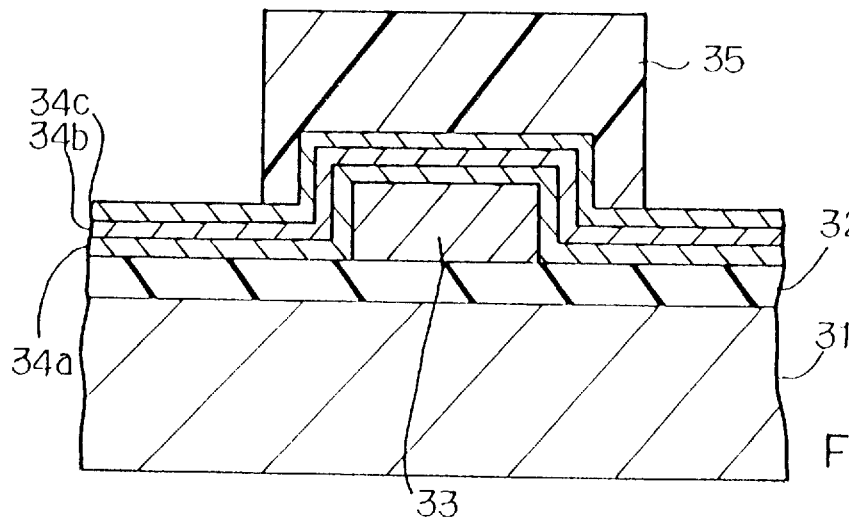

On the lower insulating layer 32, a lower titanium layer 34a, a platinum layer 34b and an upper titanium layer 34c are successively deposited, and the aluminum-based metal strip 33 is covered with the metal layers 34a, 34b and 34c. The resultant structure is illustrated in figure 7B.

Photo-resist solution is spun onto the upper titanium layer 34c, and is baked so as to form a photo-resist layer. A wiring pattern is optically transferred to the photo-resist layer, and the photo-resist layer is developed for providing a photo-resist mask 35. The photo-resist mask 35 is wider than the aluminum-based metal strip 33.

Figure 7D:
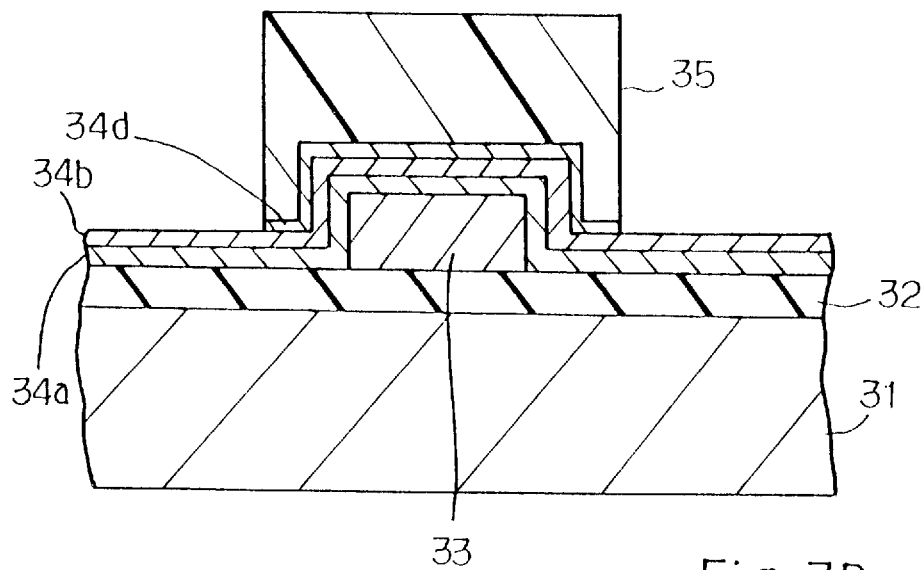

Using the photo-resist mask 35, the upper titanium layer is partially etched away by using potassium iodide solution as an etchant, and the patterned titanium layer 34d serves as a patterning mask for the platinum layer 34b. The resultant structure is illustrated in FIG. 7D.

Figure 7E:
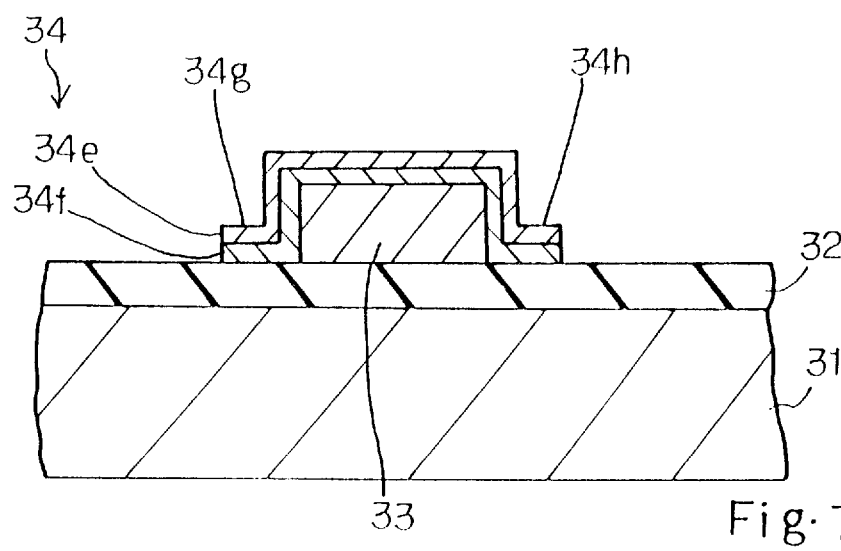

The photo-resist mask 35 is stripped off, and the platinum layer 34b is partially etched away by using aqua regia at 80 degrees centigrade. The patterned platinum layer 34e is left beneath the patterned titanium layer 34d. Finally, the exposed portion of the lower titanium layer 34a is etched away by using the potassium iodide solution, and the titanium on the patterned platinum layer 34e is concurrently removed in the potassium iodide solution. The resultant structure is illustrated in FIG. 7E.

The patterned titanium layer 34f and the patterned platinum layer 34e form in combination a barrier layer 34 covering the entire surface of the aluminum-based metal strip 33, and the barrier layer 34 prevents the aluminum-based metal strip 33 from the electro-migration. Moreover, the barrier layer 34 has fin portions 34g and 34h on both sides of the aluminum-based metal strip 33, and the fin portions 34g and 34h extend on the lower insulating layer 32 along the aluminum-based metal strip 33. The fin portions 34g and 34h are intentionally formed in the barrier layer 34, and rescue the wiring structure from a mask mis-alignment between the aluminum-based metal layer 33 and a contact-hole (not shown).

Fifth Embodiment

Figure 8:
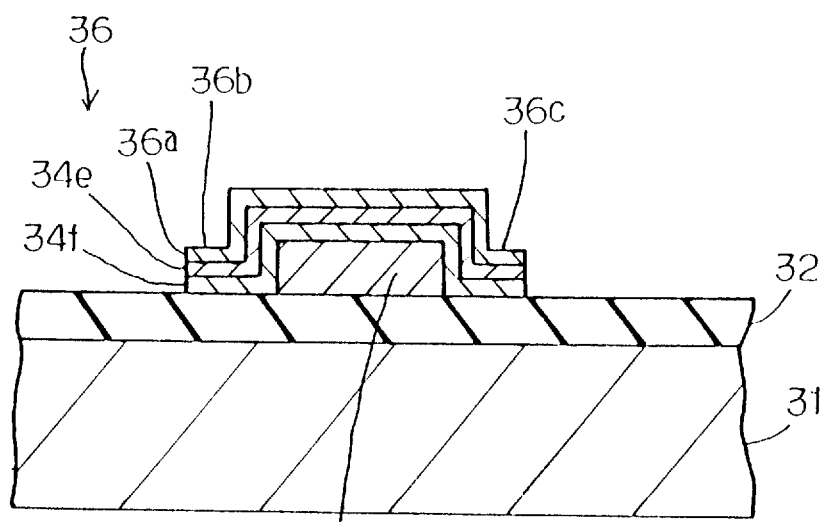
FIG. 8 is a cross sectional view showing a three-level wiring structure according to the present invention.

FIG. 8 illustrates a three-level wiring structure embodying the present invention. The wiring structure implementing the fifth embodiment is fabricated on the basis of the wiring structure of the fourth embodiment, and, for this reason, layers of the fifth embodiment corresponding to the layers of the fourth embodiment are labeled with the same references used in FIGS. 7A to 7E without detailed description.

The wiring structure also comprises the aluminum-based strip 33 and a barrier layer 36. The barrier layer 36 includes the titanium layer 34f and the platinum layer 34e as similar to the fourth embodiment. The barrier layer 36 further includes a gold layer 36a covering the platinum layer 34e, and the gold layer 36a is laminated on the platinum layer by using a plating technique. The three-level barrier layer 36 also has fin portions 36b and 36c, and is more resistive against the electro-migration under higher current density.

The fifth embodiment achieves all the advantages of the first embodiment.

Multi-Layer Wiring Structure

The wiring structures embodying the present invention are available for a multi-level wiring structure. FIG. 9 illustrates a wiring structure incorporated in a semiconductor integrated circuit device fabricated on a semiconductor substrate 40. The semiconductor integrated circuit device comprises a plurality of circuit components such as a field effect transistor 41, a multi-level wiring structure 42 and an inter-level insulating structure 43. The multi-level wiring structure 42 functionally connects the circuit components to one another, and the forms an integrated circuit together with the circuit components. Although only one field effect transistor 41 is illustrated in an active area defined by a field oxide layer 42, a large number of field effect transistors are incorporated in the integrated circuit, and the field effect transistor 41 is a representative of these field effect transistors.

The multi-level wiring structure include a lower wiring 42a extending on the field oxide layer 42 and an upper wiring 42b extending on an inter-level insulating layer 43a of the multi-level insulating structure 43. A contact hole 43b is formed in the inter-level insulating layer 43a, and the upper wiring 42b is held in contact with the lower wiring 42a through the contact hole 43b.

The lower wiring 42a includes an aluminum-based metal strip 42c and a barrier layer 42d. The aluminum-based metal strip 42c extends on the field oxide layer 42, and a titanium layer 42e and a titanium nitride layer 42f form in combination the barrier layer 42d, by way of example. The barrier layer 42d is wider than the aluminum-based metal strip 42c, and has fin portions 42g and 42h extending on the field oxide layer 42 along the aluminum-based metal strip 42c.

A smooth flat surface is created on the inter-level insulating layer 43a, and the upper wiring 42b extends on the smooth surface of the inter-level insulating layer 43a. A polishing or another mechanical or chemical-mechanical flattening process may be used for creating the smooth flat surface. Similarly, the upper wiring 42b includes an aluminum-based metal strip 42i and a barrier layer 42j. The aluminum-based metal strip 42i extends on the field oxide layer 42, and a titanium layer 42k and a titanium nitride layer 42m form in combination the barrier layer 42j, by way of example. The barrier layer 42j is wider than the aluminum-based metal strip 42i, and has fin portions 42n and 42o extending on the field oxide layer 42 along the aluminum-based metal strip 42i. The aluminum-based metal strip 42i has a projection 42*p*, and the projection 42*p* passes through the contact hole 43*b* so as to be held in contact with the titanium nitride layer 42*f*.

The contact hole 43*b* may be plugged with a piece of tungsten. The tungsten plug may be patterned from a tungsten layer deposited over the entire surface of the inter-level insulating layer 43*a* by using a chemical vapor deposition. The tungsten plug prevents the aluminum-based metal strip 42*i* from contamination due to the refractory metal layer of the lower wiring 42*d*.

Figure 10A:
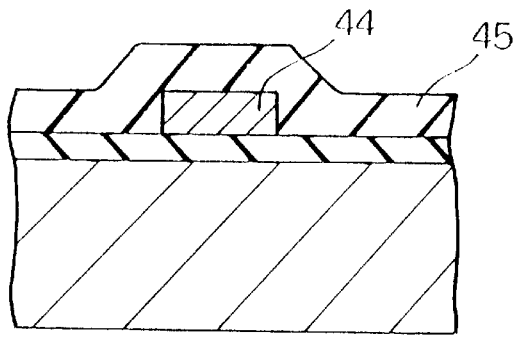
FIGS. 10A to 10C are cross sectional view showing a prior art process of forming a contact hole in an inter-level insulating layer.

Even if a mask mis-alignment takes place during the formation of the contact hole 43*b*, the fin portions 42*g* and 42*h* does not increase the contact resistance between the lower wiring 42*a* and the upper wiring 42*b*. If the fin portions 42*g* and 42*h* are not incorporated in the lower wiring, the lower wiring 44 has a rectangular cross section as shown in FIG. 10A, and the lower wiring 44 is covered with an inter-level insulating layer 45.

Figure 10B:
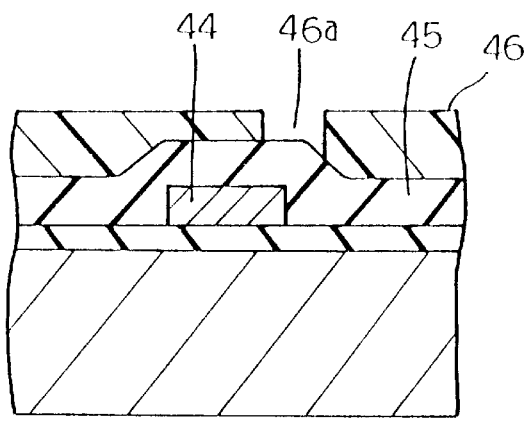
Figure 10C:
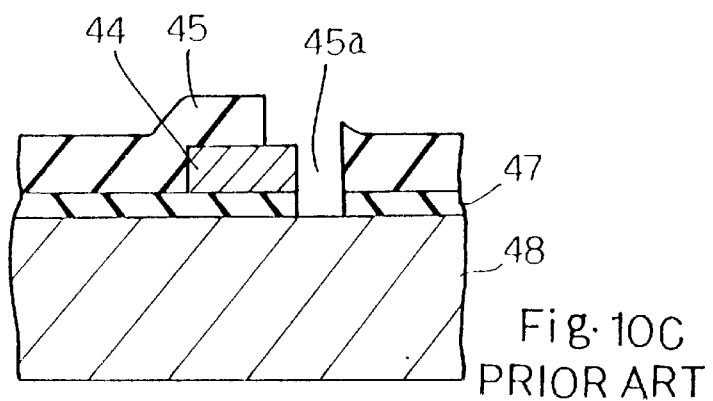

When a reticle (not shown) is moved into a path of optical radiation in an aligner (not shown), a mis-alignment is assumed to take place. Optical radiation inappropriately transfers the reticle pattern to a photo-resist layer, and patterned photo-resist layer 46 has a hole 46*a* deviated from an appropriate portion over the aluminum-based metal strip 44 as shown in FIG. 10B. Using the photo-resist mask 46, the inter-level insulating layer 45 is partially etched away so as to form a contact hole 45*a*. If the reticle pattern is transferred to the appropriate position, the contact hole 45*a* reaches the upper surface of the aluminum-based metal strip 44. However, the photo-resist mask 45 allows the etchant to form the contact hole 45*a* passing through not only the inter-level insulating layer 45 but also a lower insulating layer 47, and a semiconductor substrate 48 is exposed to the contact hole 45*a* as shown in FIG. 10C. If an upper wiring (not shown) passes through the contact hole 45*a*, undesirable short-circuit takes place between the semiconductor substrate 48 and the upper wiring.

However, the fin portions 42*g* and 42*h* of the lower wiring 42*a* prevents the upper wiring 42*b* forming the short-circuit. FIGS. 11A to 11D and 12 illustrate a process sequence for forming the multi-level wiring structure 42 according to the present invention.

Figure 11A:
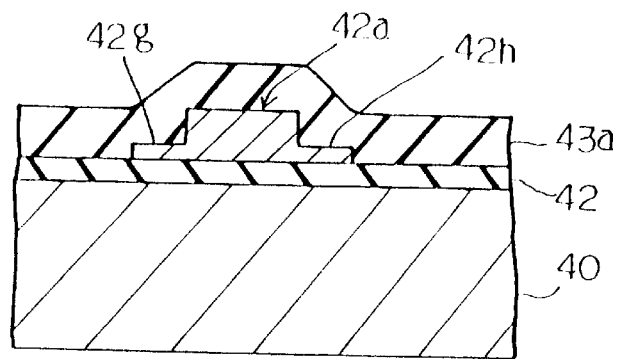
FIGS. 11A to 11D are cross sectional views showing a process sequence for forming a contact hole in an inter-level insulating layer according to the present invention.
Figure 11B:
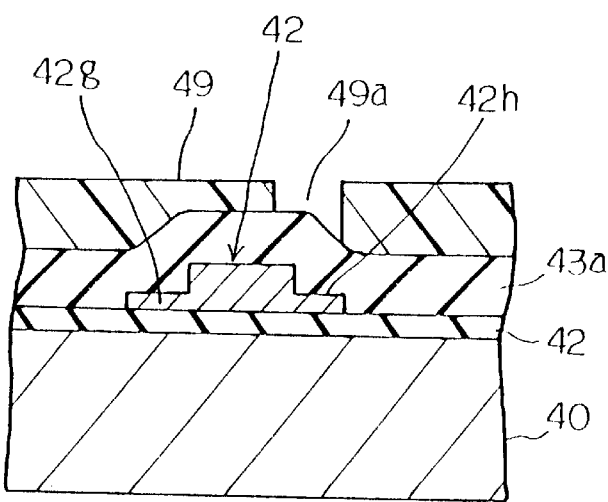

FIG. 11A illustrates the inter-level insulating layer 43*a* covering the lower wiring 42*a*. The structure is placed on a stage of an aligner (not shown), and a reticle is moved into an optical path. However, the mis-alignment takes place as similar to the prior art process. The reticle pattern is inappropriately transferred to a photo-resist layer, and a photo-resist mask 49 is patterned from the photo-resist layer. An opening 49*a* is not positioned over the lower wiring 42, but is deviated from the appropriate position as shown in FIG. 11B.

Figure 11C:
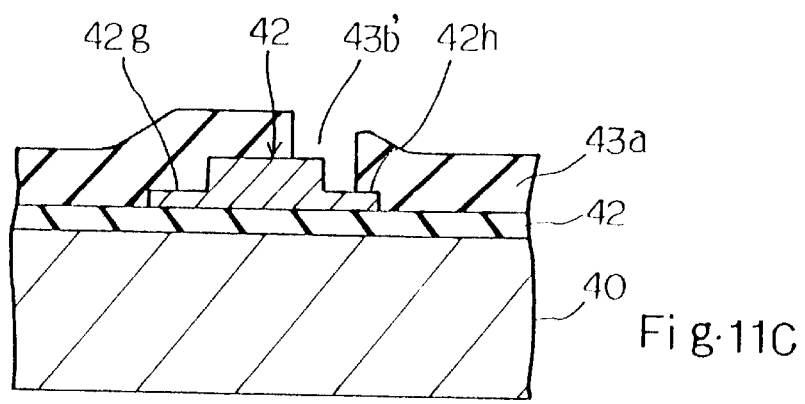

Using the photo-resist mask 49, the inter-level insulating layer 43*a* is partially etched away, and a contact hole 43*b'* is formed beneath the opening 49*a*. Although the contact hole 43*b'* is deviated from the appropriate position over the aluminum-based metal strip 42*c* (FIG. 9), the fin portion 42*h* serves as the etching stopper, and the contact hole 43*b'* does not reach the semiconductor substrate 40 as shown in FIG. 11C.

Figure 11D:
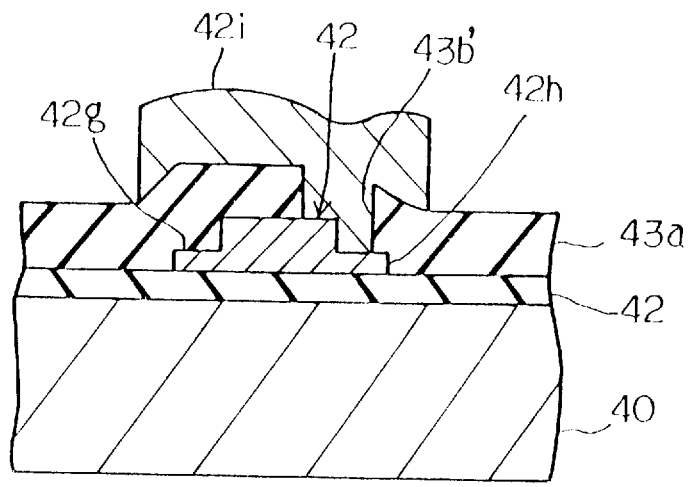
Figure 12:
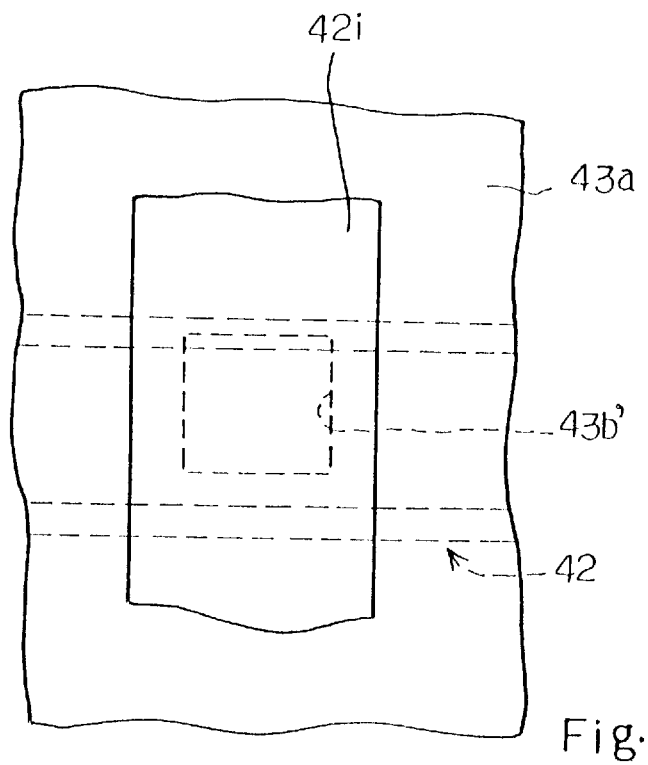
FIG. 12 is a plan view showing the multi-level wiring structure shown in FIG. 11D.

The aluminum-based metal strip 42*i* is formed on the inter-level insulating layer 43*a*, and the aluminum-based metal strip 42*i* is held in contact with the titanium nitride layer 42*f* as shown in FIGS. 9, 11D and 12. Therefore, the contact area between the lower and upper wirings 42*a* and 42*b* is not decreased.

The aluminum-based metal strips 42*c* and 42*i* are covered with the barrier layers 42*d* and 42*j*, and is prevented from the electro-migration. The titanium layers 42*e* and 42*k* strongly anchor the titanium nitride layers 42*f* and 42*m* to the aluminum-based layers 42*c* and 42*i*, and the lower and upper wirings 42*a* and 42*b* are highly reliable.

A process of fabricating the multi-level wiring structure 42 is analogous from one of the process sequences described hereinbefore. The lower wiring 42*a* is formed through one of the process sequences, the contact hole 42*b* is formed through the process shown in FIGS. 11A to 11D, and the upper wiring 42*b* is formed as similar to the lower wiring 42*a*.

Although particular embodiments of the present invention have been shown and described, it will be obvious to those skilled in the art that various changes and modifications may be made without departing from the spirit and scope of the present invention.

What is claimed is:

1. A wiring structure incorporated in a semiconductor integrated circuit device, comprising:
    a core metal strip formed of a substance selected from the group consisting of aluminum and aluminum-alloy, and extending on an insulating layer; and
    a barrier layer against an electro-migration including at least one refractory metal layer, said at least one refractory metal layer having
    a central portion covering an entire exposed surface of said core metal strip, and
    fin portions respectively projecting from both sides of said central portion onto said insulating layer and extending along a longitudinal direction of said core metal strip so as to allow a contact hole to be offset from said central portion, wherein said insulating layer covers an impurity region formed in a semiconductor substrate, said contact hole being formed in said insulating layer, and one of or both of said core metal strip and said barrier layer being electrically connected through said contact hole to said impurity region.

2. The wiring structure as set forth in claim 1, in which said barrier layer further includes a first conductive layer covering said central portion and said fin portions of said at least one refractory metal layer.

3. The wiring structure as set forth in claim 2, in which said first conductive layer is formed of a substance selected from the group consisting of another refractory metal different from the substance of said at least one refractory metal layer, a refractory metal nitride and a noble metal.

4. The wiring structure as set forth in claim 2, in which said first conductive layer is formed of a first noble metal,
    said barrier layer further including a second conductive layer covering said first conductive layer and formed of a second noble metal different from said first noble metal.

5. A wiring structure incorporated in a semiconductor integrated circuit device, comprising:
    a core metal strip formed of a substance selected from the group consisting of aluminum and aluminum-alloy, and extending on an insulating layer; and
    a barrier layer against an electro-migration including at least one refractory metal layer, said at least one refractory metal layer having
    a central portion covering an entire exposed surface of said core metal strip, and
    fin portions respectively projecting from both sides of said central portion onto said insulating layer and extending along a longitudinal direction of said core metal strip so as to allow a contact hole to be offset from said central portion, wherein said barrier layer is covered with an inter-level insulating layer, and said contact hole is formed in said inter-level insulating layer, another wiring structure being formed on said inter-level insulating layer and electrically connected through said contact hole to said barrier layer, said another wiring structure comprising another core metal strip formed of a substance selected from the group consisting of aluminum and aluminum-alloy and extending on said inter-level insulating layer, and another barrier layer against said electro-migration including another at least one refractory metal layer, said another at least one refractory metal layer having another central portion covering an entire exposed surface of said another core metal strip, and other fin portions merged with said another central portion and extending on said inter-level insulating layer along said another core metal strip.

* * * * *